(12) United States Patent
Denys

(10) Patent No.: US 6,454,258 B1
(45) Date of Patent: Sep. 24, 2002

(54) DEVICE FOR TREATING PLATE-SHAPED WORK PIECES, ESPECIALLY PRINTED-CIRCUIT BOARDS

(75) Inventor: Wilfried Denys, Oostkamp (BE)

(73) Assignee: Siemens Aktiengesellschaft (DE)

( * ) Notice: Subject to any disclaimer, the term of this patent is extended or adjusted under 35 U.S.C. 154(b) by 0 days.

(21) Appl. No.: 09/646,980

(22) PCT Filed: Mar. 23, 1999

(86) PCT No.: PCT/EP99/01984

§ 371 (c)(1),
(2), (4) Date: Sep. 25, 2000

(87) PCT Pub. No.: WO99/48780

PCT Pub. Date: Sep. 30, 1999

(30) Foreign Application Priority Data

Mar. 26, 1998 (DE) .......................... 198 13 528

(51) Int. Cl.⁷ ................................ B65H 5/02
(52) U.S. Cl. ................. 271/272; 118/405; 198/789
(58) Field of Search .................. 118/405; 271/272, 271/273, 274; 198/789

(56) References Cited

U.S. PATENT DOCUMENTS

| | | | |
|---|---|---|---|
| 3,895,139 A | * | 7/1975 | Brown et al. ............. 118/69 X |
| 4,166,689 A | * | 9/1979 | Schausberger et al. . 118/405 X |
| 4,401,522 A | | 8/1983 | Buschow et al. |
| 5,154,772 A | * | 10/1992 | Kallfass ....................... 118/404 |
| 5,772,765 A | * | 6/1998 | Hosten ........................ 118/405 |
| 5,855,238 A | * | 1/1999 | Pleschiutschnigg et al. 118/405 X |
| 5,879,738 A | * | 3/1999 | McKinnon et al. ..... 118/410 X |
| 5,992,501 A | * | 11/1999 | El Gammal et al. .... 118/405 X |

FOREIGN PATENT DOCUMENTS

| | | |
|---|---|---|
| DE | 324473 | 8/1920 |
| EP | 0 289 195 | 11/1988 |
| EP | 0 421 127 | 4/1991 |
| EP | 0 760 023 | 11/1997 |

* cited by examiner

Primary Examiner—Christopher P. Ellis
Assistant Examiner—Richard Ridley
(74) Attorney, Agent, or Firm—Harness, Dickey & Pierce PLC.

(57) ABSTRACT

The plate-shaped workpieces are conducted through a treatment cell containing a treatment bath. Vertical slots for the passage of the workpieces are provided in the end walls of the treatment cell. Paired rods or pipes arranged loosely in the treatment bath in a vertical alignment are allocated to the slots as seals. In order to also enable a treatment of thin, non-rigid workpieces, two vertically directed and preferably driven rollers for the guidance of the workpieces are arranged at the admission side outside the treatment cell and immediately preceding the seals.

15 Claims, 2 Drawing Sheets

DEVICE FOR TREATING PLATE-SHAPED WORK PIECES, ESPECIALLY PRINTED-CIRCUIT BOARDS

BACKGROUND OF THE INVENTION

EP-A-0 421 127 discloses an apparatus for treating printed circuit boards, whereby the individual printed circuit boards are continuously conducted through successively arranged treatment baths in a vertically suspended attitude on a horizontal transport path. The transport of the printed circuit boards through the treatment baths accommodated in the treatment cells occurs via clamps arranged at endlessly circulating drives, and these clamps also simultaneously assume the cathodic contacting of the printed circuit boards in the case of a galvanic treatment. Vertical slots for the passage of the printed circuit boards are situated in the end walls of the treatment cells, whereby seals fashioned as brush seals or stripper brush seals are provided in the passage region. The individual treatment cells are arranged in collecting troughs from which the collected bath fluid is continuously returned into the allocated treatment cells with the assistance of corresponding pumps. Here, too, a constant level is enabled in the individual treatment cells due to the continuous return of the bath fluid.

U.S. Pat. No. 4,401,522 discloses a similarly constructed apparatus for the electrolytic treatment of printed circuit boards wherein vertically arranged roller pairs as seals are allocated to the vertical slots in the end walls of the treatment cells. The rollers of these roller pairs, composed of elastic material, are resiliently pressed against one another and are driven at a rotational speed matched to the transport speed of the traversing printed circuit boards.

In another apparatus for the treatment of plate-shaped workpieces, particularly printed circuit boards, disclosed by EP-B-0 760 023, rods or tubes, loosely arranged in pairs in a vertical alignment in the treatment bath, are allocated to the vertical slots as seals. Due to their loose arrangement in the treatment bath, these rods or tubes are pressed against one another by the fluid pressure or against the respectively traversing workpiece and against the allocated end wall of the treatment cell. The seal of the vertical slots here is thus practically automatically effected by the pressure of the bath fluid.

The above-described sealing principle with seals loosely arranged in the treatment bath has proven excellent in the treatment of workpieces or, respectively, printed circuit boards having plate thicknesses of more than 0.25 mm. Given workpieces having plates thicknesses of up to 0.25 mm, particularly given thin, non-rigid printed circuit boards, however, deformations of the workpieces occur at the admission side upon entry into the treatment cell. These deformations are to be attributed to the high fluid pressure in the lower region of the treatment cells as a result whereof the seals are pressed more greatly against one another in the lower region and make the entry of the workpieces into the treatment cell more difficult.

EP-A-0 289 195 discloses an apparatus for treating plate-shaped workpieces, particularly printed circuit boards, in a vacuum chamber, whereby the workpieces are continuously transported into the vacuum chamber in a vertical attitude on a horizontal transport path via a first seal, a first lock chamber and a second seal and in turn depart from the vacuum chamber via a third seal, a second lock chamber and a fourth seal. Within the vacuum chamber, the workpieces are treated, for example, by sputtering, plasma etching, vapor-deposition or CVD deposition. The first and the fourth seal are respectively composed of two pipes or rods that are arranged in recesses at both sides of the transport path so that they lie against the traversing workpieces. The vertically directed seals are thereby respectively rotatably seated in a head plate and a bottom plate, whereby the vertical guidance of the workpieces ensues with a lower guide rail projecting from the bottom plate and an upper guide rail resiliently seated in the head plate. A roller pair, which is arranged at the admission side spaced from the first seal, is provided for the transport of the workpieces by inserting a workpiece into a vertical slot of the supporting housing for the first seal and, thus, pushing all workpieces lying against one another through the apparatus.

SUMMARY OF THE INVENTION

The invention is based on the problem of making the seal system in the apparatus disclosed by EP-B-0 760 023 for the treatment of plate-shaped workpieces more suitable such that a treatment of thin workpieces is also enabled.

The invention is based on the perception that a guidance and stiffening of thin work pieces is effected by a roller pair arranged immediately preceding the seats at the admission side and this then enables an unproblemmatical entry into the seals and into the treatment bath. It is thereby to be emphasized that as a result of seals arranged loosely in the treatment bath and guide rollers, both thin as well as thick work pieces can be treated.

The development which provides an additional pair of vertically arranged rollers at the discharge side of the treatment cell or bath, enables a reliable discharge of thin work pieces from the treatment bath as needed. A bending of thin work pieces upon discharge from the treatment bath, however, need only be feared in exceptional cases, since the liquid pressure onto the work pieces here corresponds to the pressure on the seals.

The development of driving the rollers facilitates the entry of the work pieces into a roller pair to a considerable extent. Even thinner work pieces than given rollers that are not driven can thus be handled.

The development of using the transport means or device to drive the rollers enables a drive of the rollers with minimum outlay. Moreover, a matching of the roller speed to the transport speed of the traversing workpieces is always assured given a drive of the rollers by the transport means. A frictional drive of the rollers by the transport means is preferred, since it is extremely rugged and can be realized with little outlay. Means for a resilient placement of one of the rollers of each pair enables an automatic adaptation of the roller guidance to the thickness of the work pieces to be respectively treated.

An exemplary embodiment of the invention is shown in the drawing and is described in greater detail below.

DESCRIPTION OF THE PREFERRED EMBODIMENTS

Figure 1:
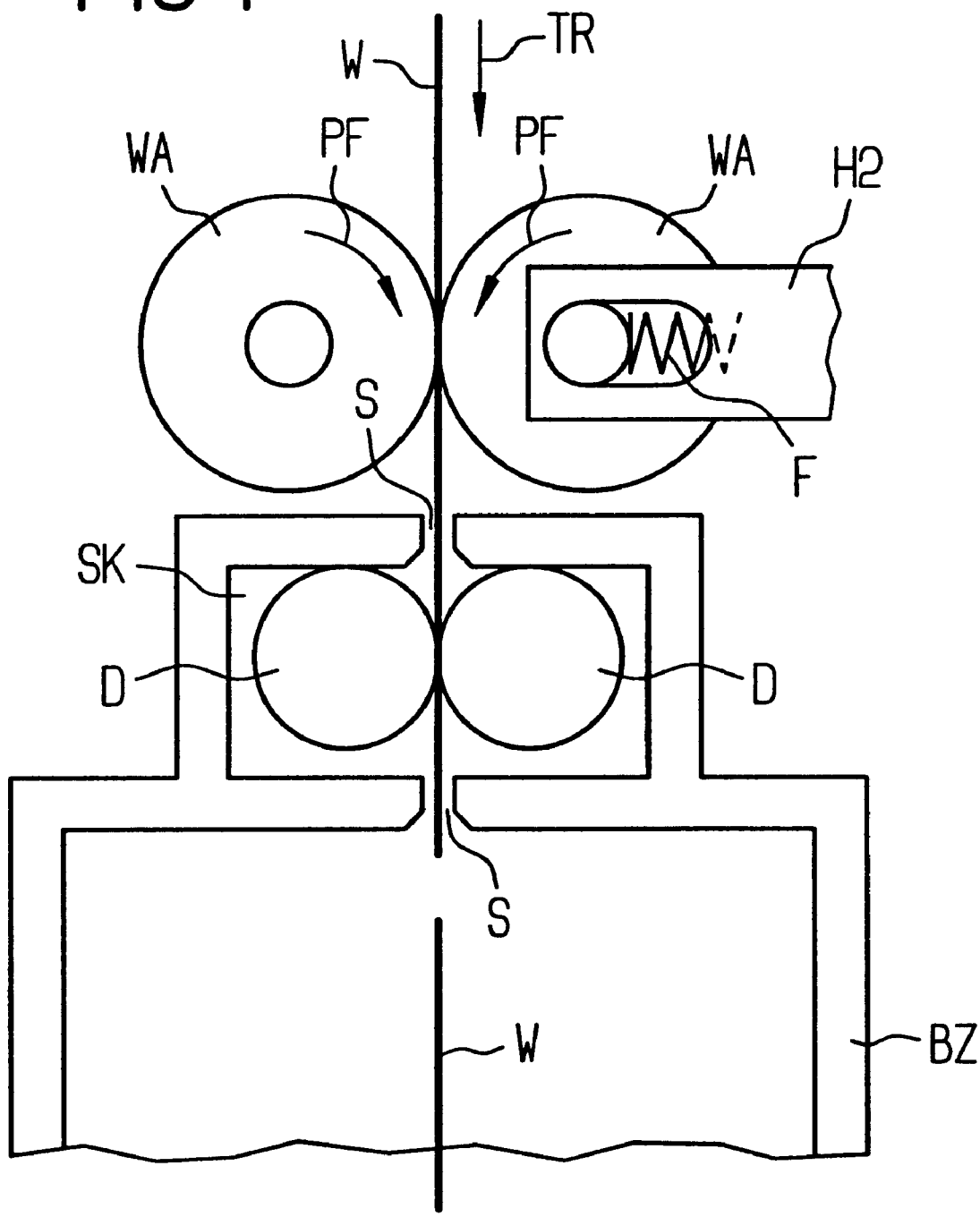
FIG. 1 is a plan view onto the admission region of a treatment cell having a guide roller pair arranged preceding the lock chamber.

FIG. 1 shows a plan view of the admission region of a treatment cell BZ containing a treatment bath through which plate-shaped work pieces W, vertically suspended at clamp-shaped transport means (not shown here) are conducted. A lock chamber SK is located at the admission end face of the treatment cell BZ, two seals, D, formed by circular-cylindrical plastic pipes or member, are loosely arranged in said lock chamber SK in a vertical alignment. The end walls of the treatment cell BZ and of the lock chamber SK are provided with vertical slots S through which the plate-shaped workpieces W can be conducted unimpeded.

The fluid pressure of the treatment bath present in the treatment cell BZ and in the lock chamber SK influences about three-quarters of the circumference of the seals D, whereas the normal atmospheric pressure influences the remaining fourth from the outside. The resulting forces acting on the seals D press the seals D against, on the one hand, the traversing workpiece W and, on the other hand, against the end wall of the lock chamber SK. An effective seal thus derives that at least largely prevents the emergence of bath fluid through the outer, vertical slot S. When a workpiece W is not situated between the two seals D, then they are pressed against one another and thus likewise prevent the emergence of bath fluid.

Due to the high fluid pressure in the lower region of the treatment cell BZ, the two seals D thereat are also pressed more greatly against one another or against a traversing workpiece W than is the case in the upper region. Given workpieces W having plate thickness up to 0.25 mm, particularly given thin, non-rigid printed circuit boards, deformations of the workpieces W therefore occur at the admission side upon entry into the lock chamber SK. In order to prevent these deformations, two vertically directed rollers WA for guidance of the workpieces W are arranged immediately preceding the lock chamber SK. These two rollers WA driven in the direction of the arrows PF seize the workpieces W entering in transport direction TR and guide them through the vertical slot S of the lock chamber SK to the seals D arranged therein. Since the two rollers WA effect a vertical stiffening of the workpieces W and are arranged immediately preceding the lock chamber SK, the risk of a bending upon entry into the seals D can be precluded even given extremely thin workpieces W.

Figure 3:
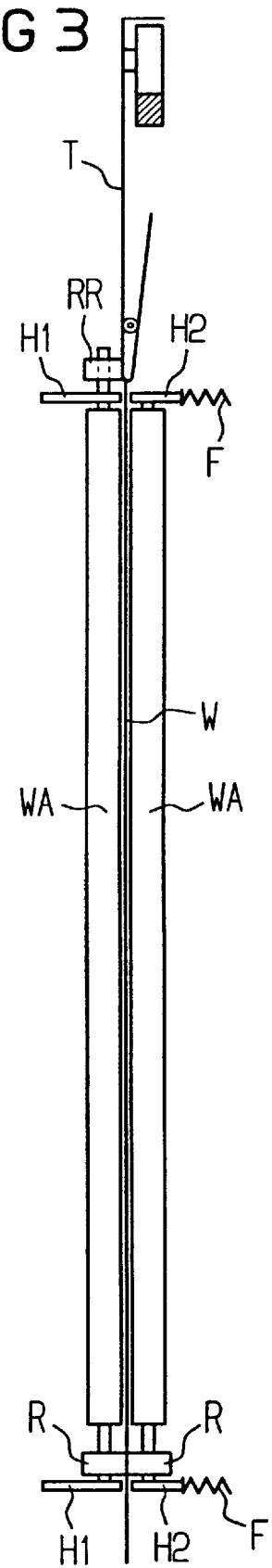
FIG. 3 is a side view of a guide roller pair.

As can be particularly seen in FIG. 3, one of the two rollers WA is firmly arranged in a holder Hi, whereas the other roller WA is arranged in a holder H2 pressed against the first roller WA via springs F. Due to this resilient arrangement of the two rollers WA, an automatic adaptation of the roller guidance to different thickness of the respectively entering workpieces W is enables.

FIG. 3 also shows the clamp-shaped transport means T already mentioned in conjunction with FIG. 1 at which the plate-shaped workpieces W are conducted through the treatment cell BZ suspended vertically. The firmly arranged roller WA is driven via an upper friction wheel RR by these clamp-shaped transport means T. The drive of the resiliently arranged roller WA then ensues via two wheels R that are respectively arranged at the lower ends of a rollers WA and likewise frictionally engage into one another in the illustrated exemplary embodiment.

Figure 2:
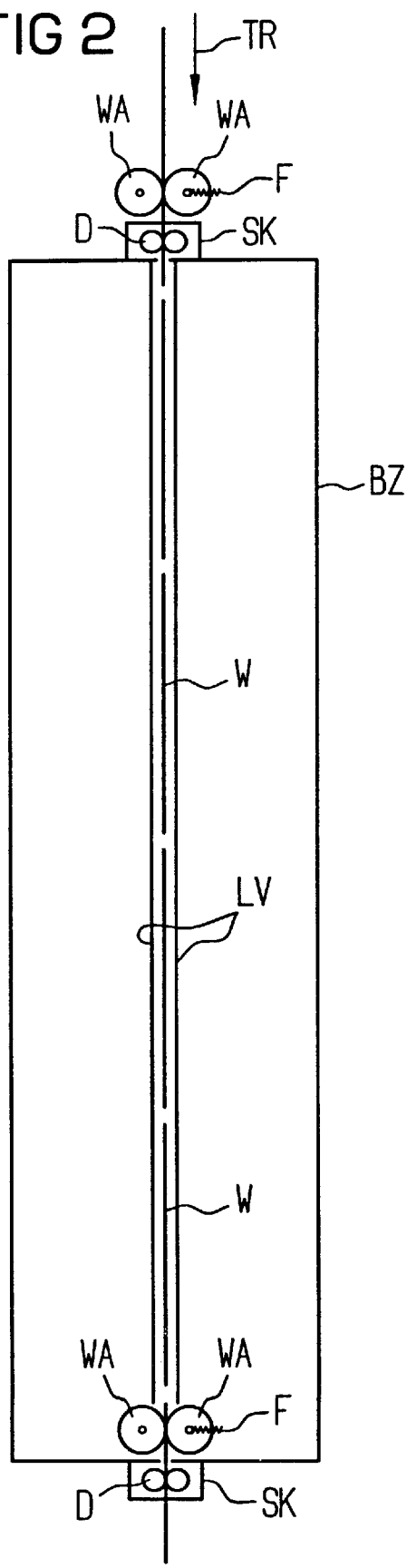
FIG. 2 is a plan view onto the overall treatment cell according to FIG. 1 with a second guide roller pair arranged at the discharge side within the treatment us bath preceding the lock chamber.

FIG. 2 shows a plan view onto the treatment cell BZ shown only at the admission side in FIG. 1. It can be seen that a lock chamber SK with two seals D provided therein is likewise provided at the discharge side. In contrast to the admission region, however, the two rollers WA of the discharge side are arranged within the treatment cell BZ immediately preceding the lock chamber SK as viewed in transport direction TR.

FIG. 2 also shows a guide device LV, which extends in the transport direction TR within the treatment cell BZ. The job of this guide LV is to designationally guide thin workpieces W such as, for example, non-rigid printed circuit boards, particularly in their lower region. Due to the interaction of this guide device LV with the two roller guides arranged at the admission side as well as at the discharge side in the illustrated exemplary embodiment, a dependable guidance through the entire treatment cell BZ derives even given extremely thin workpieces.

I claim:

1. An apparatus for treating plate-shaped workpieces including printed circuit boards, said apparatus comprising:
    transport means for guiding the workpieces in a vertical attitude on a horizontal transport path through at least one treatment bath;
    a treatment cell for the acceptance of the at least one treatment bath, said cell having end walls with vertical slots for a passage of the workpieces through the cell;
    seals being allocated to each vertical slot, each seal being formed by paired cylindrical members loosely arranged in the treatment bath in a vertical alignment; and
    a pair of vertically directed rollers for the guidance of the workpieces being arranged outside the treatment cell immediately preceding the seals at an admission side of the cell,
    wherein the rollers are driven by the transport means of the workpieces.

2. An apparatus according to claim 1, which includes an additional pair of vertically directed rollers for the guidance of the workpieces arranged at a discharge side of the treatment cell immediately preceding the seals and within the cell.

3. An apparatus according to claim 2, wherein each pair of rollers are driven.

4. An apparatus according to claim 3, which includes means for resiliently pressing one roller of each pair toward a neighboring roller of the pair.

5. An apparatus according to claim 3, wherein the rollers are frictionally driven by the transport means of the workpieces.

6. An apparatus according to claim 2, which includes means for resiliently pressing one roller of each pair toward a neighboring roller of the pair.

7. An apparatus according to claim 1, which includes means for resiliently pressing one roller of the pair toward a neighboring roller of the pair.

8. An apparatus according to claim 1, wherein the rollers are driven.

9. An apparatus according to claim 8, wherein the rollers are driven by the transport means of the workpieces.

10. An apparatus according to claim 8, wherein the rollers are frictionally driven by the transport means of the workpieces.

11. An apparatus for treating plate-shaped workpieces including printed circuit boards, said apparatus comprising:
    transport means for guiding the workpieces in a vertical attitude on a horizontal transport path through at least one treatment bath;
    A treatment cell for the acceptance of the at least one treatment bath, said cell having end walls with vertical slots for a passage of the workpieces through the cell;
    seals being allocated to each vertical slot, each seal being formed by paired cylindrical members loosely arranged in the treatment bath in a vertical alignment; and
    a pair of vertically directed rollers for the guidance of the workpieces being arranged outside the treatment cell immediately preceding the seals at an admission side of the cell, wherein the rollers are frictionally driven by the transport means of the workpieces.

12. An apparatus according to claim 11, which includes an additional pair of vertically directed rollers for the guidance of the workpieces arranged at a discharge side of the treatment cell immediately preceding the seals and within the cell.

13. An apparatus according to claim 11, wherein each pair of rollers are driven.

14. An apparatus according to claim 13, which includes means for resiliently pressing one roller of each pair toward a neighboring roller of the pair.

15. An apparatus according to claim 11, which includes means for resiliently pressing one roller of the pair toward a neighboring roller of the pair.

* * * * *